United States Patent
Bourilkov et al.

(10) Patent No.: US 10,184,988 B2
(45) Date of Patent: *Jan. 22, 2019

(54) REMOTE SENSING OF REMAINING BATTERY CAPACITY USING ON-BATTERY CIRCUITRY

(71) Applicant: DURACELL U.S. OPERATIONS, INC., Wilmington, DE (US)

(72) Inventors: Jordan Todorov Bourilkov, Bethany, CT (US); Sergio Coronado Hortal, Bethel, CT (US); Steven Jeffrey Specht, Brookfield, CT (US)

(73) Assignee: DURACELL U.S. OPERATIONS, INC., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/413,334

(22) Filed: Jan. 23, 2017

(65) Prior Publication Data
US 2017/0131365 A1     May 11, 2017

Related U.S. Application Data

(63) Continuation of application No. 14/041,014, filed on Sep. 30, 2013, now Pat. No. 9,551,758.
(Continued)

(51) Int. Cl.
*G01R 31/36* (2006.01)

(52) U.S. Cl.
CPC ..... *G01R 31/3689* (2013.01); *G01R 31/3627* (2013.01); *G01R 31/3637* (2013.01); *G01R 31/362* (2013.01); *G01R 31/3606* (2013.01)

(58) Field of Classification Search
CPC ............ G01R 31/3627; G01R 31/3637; G01R 31/3689; G01R 31/3606; G01R 31/362
(Continued)

(56) References Cited

U.S. PATENT DOCUMENTS

| | | |
|---|---|---|
| 3,354,565 A | 11/1967 | Emmons et al. |
| 3,992,228 A | 11/1976 | Depoix |

(Continued)

FOREIGN PATENT DOCUMENTS

| | | |
|---|---|---|
| CN | 1084281 A | 3/1994 |
| CN | 1228540 A | 9/1999 |

(Continued)

OTHER PUBLICATIONS

Translation of JP2007171045, Controller for Battery, and Estimation Method of Polarized Voltage of Secondary Battery, Jul. 5, 2007, Morishita Nobuyasu and Iida Takuma, , Panasonic EV Energy Co Ltd, p. 1-11.*
(Continued)

*Primary Examiner* — Eman Alkafawi
(74) *Attorney, Agent, or Firm* — Marshall, Gerstein & Borun, LLP

(57) ABSTRACT

A method of remote sensing a charge includes charging or discharging a first capacitor of a first RC circuit and a second capacitor of a second RC circuit to a predetermined threshold voltage using a power source. When each of the capacitors reach the predetermined threshold voltage, a response signal is provided from a communications module to a handheld computing device comprising a reader system. An amount of time between the response signals is determined. The amount of time is indicative of charge information.

7 Claims, 7 Drawing Sheets

Related U.S. Application Data

(60) Provisional application No. 61/746,265, filed on Dec. 27, 2012.

(58) Field of Classification Search
USPC .............................. 702/63; 320/132; 324/427
See application file for complete search history.

(56) References Cited

U.S. PATENT DOCUMENTS

| | | | |
|---|---|---|---|
| 3,993,985 A | 11/1976 | Chopard et al. |
| 4,117,475 A | 9/1978 | Ebihara et al. |
| 4,149,146 A | 4/1979 | Ebihara et al. |
| 4,238,554 A | 12/1980 | Barrella |
| 4,302,751 A | 11/1981 | Nakauchi et al. |
| 4,460,870 A | 7/1984 | Finger |
| 4,482,615 A | 11/1984 | Rosansky et al. |
| 4,598,243 A | 7/1986 | Kawakami |
| 4,654,280 A | 3/1987 | Bailey |
| 4,759,765 A | 7/1988 | Van Kampen |
| 4,808,497 A | 2/1989 | Blomgren et al. |
| 4,860,185 A | 8/1989 | Brewer et al. |
| 4,952,330 A | 8/1990 | Leger et al. |
| 5,015,544 A | 5/1991 | Burroughs et al. |
| 5,032,825 A | 7/1991 | Kuznicki |
| 5,219,683 A | 6/1993 | Webber |
| 5,231,356 A | 7/1993 | Parker |
| 5,250,905 A | 10/1993 | Kuo et al. |
| 5,290,414 A | 3/1994 | Marple |
| 5,339,024 A | 8/1994 | Kuo et al. |
| 5,355,089 A | 10/1994 | Treger |
| 5,366,832 A | 11/1994 | Hayashi et al. |
| 5,389,458 A | 2/1995 | Weiss et al. |
| 5,389,470 A | 2/1995 | Parker et al. |
| 5,396,177 A | 3/1995 | Kuo et al. |
| 5,418,086 A | 5/1995 | Bailey |
| 5,424,722 A | 6/1995 | Inada et al. |
| 5,438,607 A | 8/1995 | Przygoda, Jr. et al. |
| 5,458,992 A | 10/1995 | Bailey |
| 5,458,997 A | 10/1995 | Crespi et al. |
| 5,491,038 A | 2/1996 | DePalma et al. |
| 5,494,496 A | 2/1996 | Huhndorff et al. |
| 5,514,491 A | 5/1996 | Webber |
| 5,525,439 A | 6/1996 | Huhndorff et al. |
| 5,543,246 A | 8/1996 | Treger |
| 5,569,556 A | 10/1996 | Bohmer |
| 5,587,573 A | 12/1996 | Owen et al. |
| 5,596,278 A | 1/1997 | Lin |
| 5,607,790 A | 3/1997 | Hughen et al. |
| 5,627,472 A | 5/1997 | Ofer et al. |
| 5,633,592 A | 5/1997 | Lang |
| 5,640,150 A | 6/1997 | Atwater |
| 5,691,083 A | 11/1997 | Bolster |
| 5,737,114 A | 4/1998 | Bailey |
| 5,786,106 A | 7/1998 | Armani |
| 5,798,933 A | 8/1998 | Nicolai |
| 5,849,046 A | 12/1998 | Bailey |
| 5,925,479 A | 7/1999 | Wei et al. |
| 5,959,568 A | 9/1999 | Woolley |
| 5,963,012 A | 10/1999 | Garcia et al. |
| 6,014,014 A | 1/2000 | Owen et al. |
| 6,084,523 A | 7/2000 | Gelnovatch et al. |
| 6,127,062 A | 10/2000 | Sargeant et al. |
| 6,143,439 A | 11/2000 | Yoppolo et al. |
| 6,156,450 A | 12/2000 | Bailey |
| 6,169,397 B1 | 1/2001 | Steinbach et al. |
| 6,171,729 B1 | 1/2001 | Gan et al. |
| 6,208,235 B1 | 3/2001 | Trontelj |
| 6,218,054 B1 | 4/2001 | Webber |
| 6,252,377 B1 * | 6/2001 | Shibutani ............ G01R 31/3624 320/132 |
| 6,275,161 B1 | 8/2001 | Wan et al. |
| 6,300,004 B1 | 10/2001 | Tucholski |
| 6,407,534 B1 | 6/2002 | Mukainakano |
| 6,469,471 B1 | 10/2002 | Anbuky et al. |
| 6,483,275 B1 | 11/2002 | Nebrigic et al. |
| 6,587,250 B2 | 7/2003 | Armgarth et al. |
| 6,617,069 B1 | 9/2003 | Hopper et al. |
| 6,617,072 B2 | 9/2003 | Venkatesan et al. |
| 6,627,353 B1 | 9/2003 | Munshi |
| 6,670,073 B2 | 12/2003 | Tucholski et al. |
| RE38,518 E | 5/2004 | Tucholski |
| 6,730,136 B2 | 5/2004 | Webber |
| 6,774,685 B2 | 8/2004 | O'Toole et al. |
| 6,775,562 B1 | 8/2004 | Owens et al. |
| 6,849,360 B2 | 2/2005 | Marple |
| 6,979,502 B1 | 12/2005 | Gartstein et al. |
| 7,067,882 B2 | 6/2006 | Singh |
| 7,079,079 B2 | 7/2006 | Jo et al. |
| 7,157,185 B2 | 1/2007 | Marple |
| 7,386,404 B2 | 6/2008 | Cargonja et al. |
| 7,474,230 B2 | 1/2009 | Blom et al. |
| 7,489,431 B2 | 2/2009 | Malmstrom et al. |
| 7,511,454 B1 | 3/2009 | Legg |
| 7,561,050 B2 | 7/2009 | Bhogal et al. |
| 7,576,517 B1 | 8/2009 | Cotton et al. |
| 7,586,416 B2 | 9/2009 | Ariyoshi et al. |
| 7,598,880 B2 | 10/2009 | Powell et al. |
| 7,606,530 B1 | 10/2009 | Anderson et al. |
| 7,715,884 B2 | 5/2010 | Book et al. |
| 7,741,970 B2 | 6/2010 | Cunningham et al. |
| 7,745,046 B2 | 6/2010 | Kim et al. |
| 7,768,236 B2 | 8/2010 | Takamura et al. |
| 7,772,850 B2 | 8/2010 | Bertness |
| 7,805,263 B2 | 9/2010 | MacK |
| 7,911,182 B2 | 3/2011 | Cargonja et al. |
| 7,944,368 B2 | 5/2011 | Carter et al. |
| 8,031,054 B2 | 10/2011 | Tuttle |
| 8,106,845 B2 | 1/2012 | Savry |
| 8,119,286 B2 | 2/2012 | Issaev et al. |
| 8,131,486 B2 | 3/2012 | Leonard et al. |
| 8,344,685 B2 | 1/2013 | Bertness et al. |
| 8,368,356 B2 | 2/2013 | Nakashima et al. |
| 8,424,092 B2 | 4/2013 | Ikeuchi et al. |
| 8,427,109 B2 * | 4/2013 | Melichar ............ B60L 11/1861 320/132 |
| 8,471,888 B2 | 6/2013 | George et al. |
| 8,652,670 B2 | 2/2014 | Uchida |
| 8,653,926 B2 | 2/2014 | Detcheverry et al. |
| 8,900,731 B2 | 12/2014 | Bohne |
| 8,905,317 B1 | 12/2014 | Hsu et al. |
| 9,037,426 B2 * | 5/2015 | Schaefer ............ G01R 31/3624 320/116 |
| 9,060,213 B2 | 6/2015 | Jones |
| 9,076,092 B2 | 7/2015 | Ritamaki et al. |
| 9,083,063 B2 | 7/2015 | Specht et al. |
| 9,146,595 B2 | 9/2015 | Forutanpour et al. |
| 9,167,317 B2 | 10/2015 | DeMar |
| 9,189,667 B2 | 11/2015 | Bourilkov et al. |
| 9,235,044 B2 | 1/2016 | Specht et al. |
| 9,297,859 B2 | 3/2016 | Mukaitani et al. |
| 9,312,575 B2 | 4/2016 | Stukenberg et al. |
| 9,331,378 B2 | 5/2016 | Merlin et al. |
| 9,453,885 B2 | 9/2016 | Mukaitani et al. |
| 9,459,323 B2 | 10/2016 | Mukaitani et al. |
| 9,461,339 B2 | 10/2016 | Roohparvar |
| 9,478,850 B2 | 10/2016 | Bourilkov et al. |
| 9,551,758 B2 | 1/2017 | Bourilkov et al. |
| 9,568,556 B2 | 2/2017 | Bourilkov et al. |
| 9,619,612 B2 | 4/2017 | Kallfelz et al. |
| 9,639,724 B2 | 5/2017 | Bourilkov et al. |
| 9,661,576 B2 | 5/2017 | Tomisawa |
| 9,699,818 B2 | 7/2017 | Grothaus et al. |
| 9,726,763 B2 | 8/2017 | Dempsey et al. |
| 9,739,837 B2 | 8/2017 | Bourilkov et al. |
| 9,746,524 B2 | 8/2017 | Petrucelli |
| 9,823,310 B2 | 11/2017 | Bourilkov et al. |
| 9,841,462 B2 | 12/2017 | Kim et al. |
| 9,843,220 B2 | 12/2017 | Herrmann et al. |
| 9,869,726 B2 | 1/2018 | Zumstein et al. |
| 9,882,250 B2 | 1/2018 | Chappelle et al. |
| 9,887,463 B2 | 2/2018 | Bourilkov et al. |
| 9,893,390 B2 | 2/2018 | Specht et al. |
| 9,983,312 B2 | 5/2018 | Dempsey et al. |
| 2001/0005123 A1 | 6/2001 | Jones et al. |

(56) References Cited

U.S. PATENT DOCUMENTS

| | | |
|---|---|---|
| 2001/0026226 A1 | 10/2001 | Andersson et al. |
| 2002/0001745 A1 | 1/2002 | Gartstein et al. |
| 2002/0086718 A1 | 7/2002 | Bigwood et al. |
| 2003/0070283 A1 | 4/2003 | Webber |
| 2003/0169047 A1 | 9/2003 | Chen |
| 2003/0170537 A1 | 9/2003 | Randell |
| 2003/0184493 A1 | 10/2003 | Robinet et al. |
| 2003/0228518 A1 | 12/2003 | Marple |
| 2004/0029007 A1 | 2/2004 | Kusumoto et al. |
| 2004/0048512 A1 | 3/2004 | Chen |
| 2004/0183742 A1 | 9/2004 | Goff et al. |
| 2005/0038614 A1 | 2/2005 | Botts et al. |
| 2005/0073282 A1 | 4/2005 | Carrier et al. |
| 2005/0095508 A1 | 5/2005 | Yamamoto |
| 2005/0112462 A1 | 5/2005 | Marple |
| 2005/0162129 A1 | 7/2005 | Mutabdzija et al. |
| 2005/0233214 A1 | 10/2005 | Marple et al. |
| 2005/0277023 A1 | 12/2005 | Marple et al. |
| 2006/0017581 A1 | 1/2006 | Schwendinger et al. |
| 2006/0043933 A1 | 3/2006 | Latinis |
| 2006/0046152 A1 | 3/2006 | Webber |
| 2006/0046153 A1 | 3/2006 | Webber |
| 2006/0046154 A1 | 3/2006 | Webber et al. |
| 2006/0047576 A1 | 3/2006 | Aaltonen et al. |
| 2006/0163692 A1 | 7/2006 | Detecheverry et al. |
| 2006/0168802 A1 | 8/2006 | Tuttle |
| 2006/0170397 A1 | 8/2006 | Srinivasan et al. |
| 2006/0208898 A1 | 9/2006 | Swanson et al. |
| 2006/0247156 A1 | 11/2006 | Vanderby et al. |
| 2006/0261960 A1 | 11/2006 | Haraguchi et al. |
| 2007/0080804 A1 | 4/2007 | Hirahara et al. |
| 2007/0096697 A1 | 5/2007 | Maireanu |
| 2007/0108946 A1 | 5/2007 | Yamauchi et al. |
| 2007/0182576 A1 | 8/2007 | Proska et al. |
| 2007/0210924 A1 | 9/2007 | Arnold et al. |
| 2007/0273329 A1 | 11/2007 | Kobuse et al. |
| 2008/0053716 A1 | 3/2008 | Scheucher |
| 2008/0076029 A1 | 3/2008 | Bowden et al. |
| 2008/0079391 A1 | 4/2008 | Schroeck et al. |
| 2008/0157924 A1 | 7/2008 | Batra |
| 2008/0160392 A1 | 7/2008 | Toya et al. |
| 2008/0206627 A1 | 8/2008 | Wright |
| 2008/0252462 A1 | 10/2008 | Sakama |
| 2009/0008031 A1 | 1/2009 | Gould et al. |
| 2009/0009177 A1 | 1/2009 | Kim et al. |
| 2009/0024309 A1 | 1/2009 | Crucs |
| 2009/0041228 A1 | 2/2009 | Owens et al. |
| 2009/0098462 A1 | 4/2009 | Fujiwara et al. |
| 2009/0148756 A1 | 6/2009 | Specht et al. |
| 2009/0155673 A1 | 6/2009 | Northcott |
| 2009/0179763 A1 | 7/2009 | Sheng |
| 2009/0214950 A1 | 8/2009 | Bowden et al. |
| 2009/0263727 A1 | 10/2009 | Josephs et al. |
| 2009/0273473 A1 | 11/2009 | Tuttle |
| 2009/0289825 A1* | 11/2009 | Trinkle .................. G06F 1/025 341/144 |
| 2009/0297949 A1 | 12/2009 | Berkowitz et al. |
| 2010/0019733 A1 | 1/2010 | Rubio |
| 2010/0081049 A1 | 4/2010 | Holl et al. |
| 2010/0085008 A1 | 4/2010 | Suzuki et al. |
| 2010/0087241 A1 | 4/2010 | Nguyen et al. |
| 2010/0143753 A1 | 6/2010 | Kim et al. |
| 2010/0209744 A1 | 8/2010 | Kim |
| 2010/0219252 A1 | 9/2010 | Kikuchi et al. |
| 2010/0295943 A1 | 11/2010 | Cha et al. |
| 2010/0308974 A1 | 12/2010 | Rowland et al. |
| 2011/0023130 A1 | 1/2011 | Gudgel et al. |
| 2011/0104520 A1 | 5/2011 | Ahn |
| 2011/0123874 A1 | 5/2011 | Issaev et al. |
| 2011/0163752 A1 | 7/2011 | Janousek et al. |
| 2011/0293969 A1 | 12/2011 | Hoofman et al. |
| 2012/0021266 A1 | 1/2012 | Marple et al. |
| 2012/0056002 A1 | 3/2012 | Ritamaki et al. |
| 2012/0081774 A1 | 4/2012 | De Paiva Martins et al. |
| 2012/0086615 A1 | 4/2012 | Norair |
| 2012/0121943 A1 | 5/2012 | Roohparvar |
| 2012/0183862 A1 | 7/2012 | Gupta et al. |
| 2012/0190305 A1 | 7/2012 | Wuidart |
| 2012/0206102 A1 | 8/2012 | Okamura et al. |
| 2012/0206302 A1 | 8/2012 | Ramachandran et al. |
| 2012/0217971 A1 | 8/2012 | Deluca |
| 2012/0235870 A1 | 9/2012 | Forster |
| 2012/0277832 A1 | 11/2012 | Hussain |
| 2012/0299597 A1 | 11/2012 | Shigemizu |
| 2012/0323511 A1 | 12/2012 | Saigo et al. |
| 2013/0069768 A1 | 3/2013 | Madhyastha et al. |
| 2013/0127611 A1 | 5/2013 | Bernstein et al. |
| 2013/0148283 A1 | 6/2013 | Forutanpour et al. |
| 2013/0154652 A1 | 6/2013 | Rice et al. |
| 2013/0161380 A1 | 6/2013 | Joyce et al. |
| 2013/0162402 A1 | 6/2013 | Amann et al. |
| 2013/0162403 A1 | 6/2013 | Striemer et al. |
| 2013/0162404 A1 | 6/2013 | Striemer et al. |
| 2013/0164567 A1 | 6/2013 | Olsson et al. |
| 2013/0183568 A1 | 7/2013 | Babinec et al. |
| 2013/0185008 A1 | 7/2013 | Itabashi et al. |
| 2013/0271072 A1 | 10/2013 | Lee et al. |
| 2013/0295421 A1 | 11/2013 | Teramoto et al. |
| 2013/0320989 A1 | 12/2013 | Inoue et al. |
| 2014/0062663 A1 | 3/2014 | Bourilkov et al. |
| 2014/0139380 A1 | 5/2014 | Ouyang et al. |
| 2014/0188413 A1 | 7/2014 | Bourilkov et al. |
| 2014/0229129 A1 | 8/2014 | Campbell et al. |
| 2014/0302348 A1 | 10/2014 | Specht et al. |
| 2014/0302351 A1 | 10/2014 | Specht et al. |
| 2014/0320144 A1 | 10/2014 | Nakaya |
| 2014/0342193 A1 | 11/2014 | Mull et al. |
| 2014/0346873 A1 | 11/2014 | Colangelo et al. |
| 2014/0347249 A1 | 11/2014 | Bourilkov et al. |
| 2014/0370344 A1 | 12/2014 | Lovelace et al. |
| 2014/0379285 A1 | 12/2014 | Dempsey et al. |
| 2015/0061603 A1 | 3/2015 | Loftus et al. |
| 2015/0064524 A1 | 3/2015 | Noh et al. |
| 2015/0349391 A1 | 12/2015 | Chappelle et al. |
| 2016/0034733 A1 | 2/2016 | Bourilkov et al. |
| 2016/0049695 A1 | 2/2016 | Lim et al. |
| 2016/0064781 A1 | 3/2016 | Specht et al. |
| 2016/0092847 A1 | 3/2016 | Buchbinder |
| 2016/0137088 A1 | 5/2016 | Lim et al. |
| 2016/0277879 A1 | 9/2016 | Daoura et al. |
| 2017/0040698 A1 | 2/2017 | Bourilkov et al. |
| 2017/0062841 A1 | 3/2017 | Riemer et al. |
| 2017/0062880 A1 | 3/2017 | Riemer et al. |
| 2017/0092994 A1 | 3/2017 | Canfield et al. |
| 2017/0125855 A1 | 5/2017 | Gong et al. |
| 2017/0176539 A1 | 6/2017 | Younger |
| 2017/0286918 A1 | 10/2017 | Westermann et al. |
| 2017/0301961 A1 | 10/2017 | Kim et al. |
| 2017/0315183 A1 | 11/2017 | Chao et al. |
| 2017/0331162 A1 | 11/2017 | Clarke et al. |
| 2018/0040929 A1 | 2/2018 | Chappelle et al. |
| 2018/0088182 A1 | 3/2018 | Bourilkov et al. |
| 2018/0120386 A1 | 5/2018 | Riemer et al. |
| 2018/0123174 A1 | 5/2018 | Riemer et al. |
| 2018/0123175 A1 | 5/2018 | Riemer et al. |
| 2018/0123176 A1 | 5/2018 | Riemer et al. |
| 2018/0123233 A1 | 5/2018 | Bourilkov et al. |

FOREIGN PATENT DOCUMENTS

| | | |
|---|---|---|
| CN | 1315072 A | 9/2001 |
| CN | 2828963 Y | 10/2006 |
| CN | 101126795 A | 2/2008 |
| CN | 201142022 Y | 10/2008 |
| CN | 101702792 A | 5/2010 |
| CN | 101785164 A | 7/2010 |
| CN | 102097844 A | 6/2011 |
| CN | 102142186 A | 8/2011 |
| CN | 102544709 A | 7/2012 |
| CN | 202720320 U | 2/2013 |
| CN | 103682482 A | 3/2014 |
| CN | 104635169 A | 5/2015 |
| CN | 105337367 A | 2/2016 |
| CN | 205160145 U | 4/2016 |

(56) References Cited

FOREIGN PATENT DOCUMENTS

| | | |
|---|---|---|
| CN | 106405241 A | 2/2017 |
| CN | 106848448 A | 6/2017 |
| CN | 107284272 A | 10/2017 |
| CN | 206804833 U | 12/2017 |
| DE | 10118027 A1 | 11/2002 |
| DE | 10118051 A1 | 11/2002 |
| EP | 0523901 A1 | 1/1993 |
| EP | 1450174 A1 | 8/2004 |
| EP | 1693807 A1 | 8/2006 |
| EP | 1786057 A2 | 5/2007 |
| EP | 1821363 A1 | 8/2007 |
| EP | 2065962 A1 | 6/2009 |
| EP | 2204873 A1 | 7/2010 |
| EP | 2324535 A1 | 5/2011 |
| EP | 2328223 A1 | 6/2011 |
| EP | 2645447 A1 | 10/2013 |
| EP | 2680093 A2 | 1/2014 |
| EP | 2790262 A1 | 10/2014 |
| EP | 3128599 A1 | 2/2017 |
| JP | S52005581 A | 1/1977 |
| JP | 61169781 | 7/1986 |
| JP | 02142324 | 5/1990 |
| JP | H03131771 A | 6/1991 |
| JP | H09005366 A | 1/1997 |
| JP | 10014003 | 1/1998 |
| JP | 2000077928 A | 3/2000 |
| JP | 2001022905 A | 1/2001 |
| JP | 2004085580 A | 3/2004 |
| JP | 2004-253858 A | 9/2004 |
| JP | 2004534430 A | 11/2004 |
| JP | 2005327099 A | 11/2005 |
| JP | 2006139544 A | 6/2006 |
| JP | 2006284431 A | 10/2006 |
| JP | 2006324074 A | 11/2006 |
| JP | 2007515848 A | 6/2007 |
| JP | 2008042985 A | 2/2008 |
| JP | 2008-530682 A | 8/2008 |
| JP | 2009-37374 | 2/2009 |
| JP | 2010098361 A | 4/2010 |
| JP | 2010-154012 A | 7/2010 |
| JP | 2011113759 A | 6/2011 |
| JP | 2011203595 A | 10/2011 |
| JP | 2012085491 A | 4/2012 |
| JP | 2012161614 A | 8/2012 |
| JP | 2012170262 A | 9/2012 |
| JP | 2013038961 A | 2/2013 |
| JP | 2013120640 A | 6/2013 |
| KR | 2011-0018488 A | 2/2011 |
| TW | M510009 U | 10/2015 |
| TW | I580153 B | 4/2017 |
| WO | WO-95/01062 A1 | 1/1995 |
| WO | WO-03/047064 A2 | 6/2003 |
| WO | WO-2004/107251 A2 | 12/2004 |
| WO | WO-2005/078673 A1 | 8/2005 |
| WO | WO-2006/048838 A1 | 5/2006 |
| WO | WO-2006/085291 A2 | 8/2006 |
| WO | WO-2008/151181 A1 | 12/2008 |
| WO | WO-2008/156735 A1 | 12/2008 |
| WO | WO-2010/127509 A1 | 11/2010 |
| WO | WO-2011/063679 A1 | 6/2011 |
| WO | WO-2011/096863 A1 | 8/2011 |
| WO | WO-2012/051272 A2 | 4/2012 |
| WO | WO-2012/061262 A1 | 5/2012 |
| WO | WO-2012/070635 A1 | 5/2012 |
| WO | WO-2012/083759 A1 | 6/2012 |
| WO | WO-2013/022857 A2 | 2/2013 |
| WO | WO-2013/024341 A1 | 2/2013 |
| WO | WO-2013/069423 A1 | 5/2013 |
| WO | WO-2013/084481 A1 | 6/2013 |
| WO | WO-2013/101652 A1 | 7/2013 |
| WO | WO-2015/183609 A1 | 12/2015 |
| WO | WO-2016/146006 A1 | 9/2016 |
| WO | WO-2016/166735 A1 | 10/2016 |
| WO | WO-2016/172542 A1 | 10/2016 |

OTHER PUBLICATIONS

Translation of JP2006284431, System for Estimation of Charging Rate of Secondary Cell, Oct. 19, 2016, Ashizawa Hiroyuki and Yumoto Daijiro, Nissan Motor Co Ltd, p. 1-8.*

Translation of: Osamu Yamashiro, Voltage Detecting Circuit, Jan. 17, 1977, Hitashi Ltd/ Translated by USPTO via Phoenix Translations 100N. Ave. Elgin, TX 78621, pp. 1-20.*

PCT International Search Report with Written Opinion in corresponding Int'l appln. PCT/US2013/075912 dated Apr. 17, 2014.

Office Action (with English translation), Chinese Patent Application No. 201380065792.4, dated Aug. 17, 2016.

Atmel Corporation, *Application Note AVR400: Low Cost A/D Converter*, available at http://www.atmel.com/images/doc0942.pfd (last visited Oct. 24, 2013).

Japanese patent application No. 2017-026242, Notification of Reason for Rejection (English Translation), dated Jan. 9, 2018.

Kooser, Tethercell magically turns AA batteries into Bluetooth devices, CNET.com, downloaded from the Internet at: <https://www.cnet.com/news/tethercell-magically-turns-aa-batteries-into-bluetooth-devices/> (Jan. 8, 2013).

Tethercell Smart Battery Adapter fundraising campaign on Indiegogo website (<https://www.indiegogo.com/projects/tethercell-smart-battery-adapter#/>) (launched Oct. 2013).

Tethercell video uploaded at <https://vimeo.com/53823785> (Oct. 2012).

* cited by examiner

REMOTE SENSING OF REMAINING BATTERY CAPACITY USING ON-BATTERY CIRCUITRY

CROSS-REFERENCE TO RELATED APPLICATIONS

This application is a continuation of U.S. patent application Ser. No. 14/041,014, filed Sep. 30, 2013, which claims priority to Ser. No. 61/746,265, filed Dec. 27, 2012, both of which are hereby incorporated herein by reference in their entirety and made part hereof.

FIELD OF INVENTION

The present invention is generally directed to systems and methods for remote sensing of remaining battery capacity using on-battery circuitry.

BACKGROUND OF THE INVENTION

An exemplary type of a common battery tester that is placed on batteries is known as a thermochromic-type tester. In a thermochromic battery tester, there can be a circuit that is connected by a consumer manually depressing one or two button switches. Once the switch is depressed, the consumer has connected the battery to the thermochromic tester. The thermochromic tester may include a resistor—flat silver layer that has a variable width so that the electrical resistance also varies along its length. As current travels through the silver resistor, the dissipated power generates heat that changes the color of a thermochromic ink display that is over the silver resistor. The thermochromic ink display is arranged as a gauge to indicate the relative capacity of the battery. However, it is typically necessary to manually hold the battery and/or remove the battery from the device in order to test the battery using thermochromic battery testers. Other battery tester systems are desired.

SUMMARY OF THE INVENTION

In one embodiment, a method of remote sensing a remaining battery capacity is provided. The method includes charging or discharging a capacitor of an RC circuit to a predetermined threshold voltage using a power source. A response signal is provided from a communications module to a handheld computing device comprising a reader system once the capacitor reaches the predetermined threshold voltage. An amount of time taken for the capacitor to charge or discharge to the predetermined threshold voltage is determined using a processor. The processor determines remaining battery capacity information using the amount of time. In another embodiment, a remote charge indicator system operatively connected to a battery includes a communications module comprising an antenna that receives an interrogation signal from a reader system. A voltage sensing module comprises an RC circuit comprising a resistor and a capacitor. The voltage sensing module provides an output to the communications module when the capacitor charges to a predetermined threshold voltage using the battery. The voltage sensing module includes a switch that closes when the communications module receives the interrogation signal.

In another embodiment, a method of remote sensing remaining battery capacity of a battery is provided. The method includes charging or discharging a capacitor of an RC circuit operatively connected to the battery to a predetermined threshold voltage. A response signal is provided using a communications module on the battery to a handheld computing device comprising a reader system once the capacitor reaches the predetermined threshold voltage. A battery voltage is determined using an amount of time taken for the capacitor to charge or discharge to the predetermined threshold voltage using a processor. Remaining battery capacity information is determined using the battery voltage. The remaining battery capacity information is displayed using a display device of the handheld computing device.

BRIEF DESCRIPTION OF THE DRAWINGS

The following detailed description of specific embodiments of the present invention can be best understood when read in conjunction with the drawings enclosed herewith.

Figure 1:
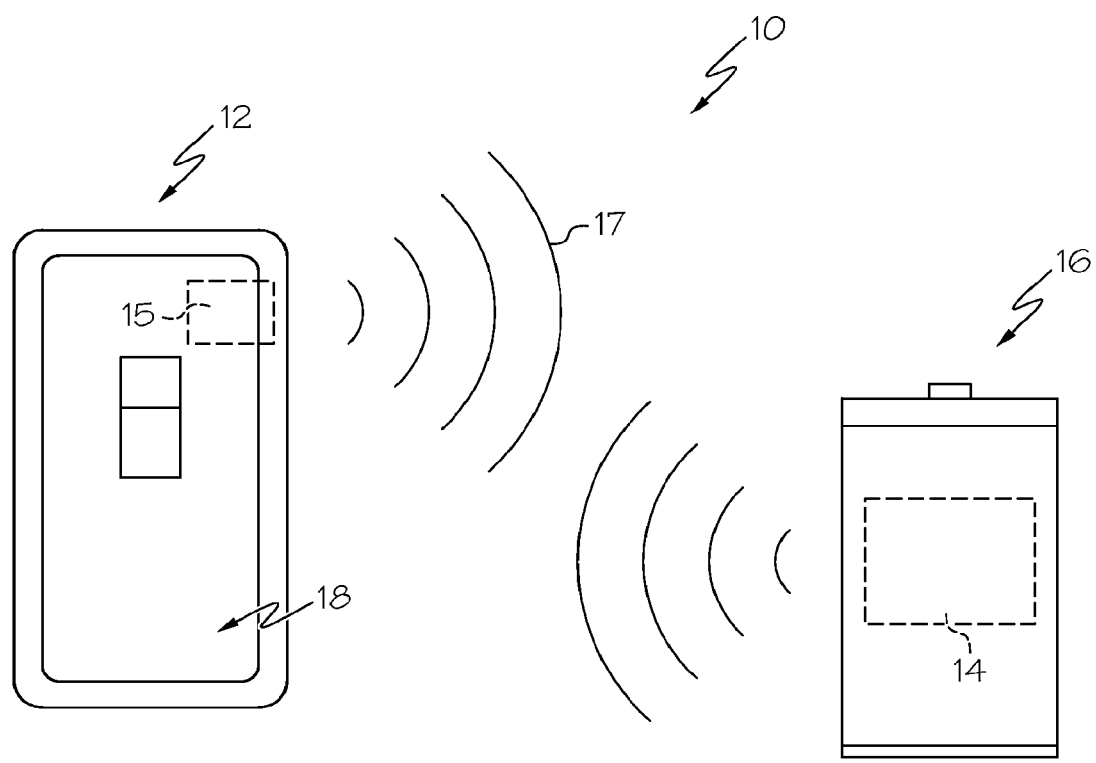
FIG. 1 illustrates an embodiment of a remote sensing system including a battery and a handheld computing device for remotely sensing a remaining battery capacity.

The embodiments set forth in the drawings are illustrative in nature and not intended to be limiting of the invention defined by the claims. Moreover, individual features of the drawings and invention will be more fully apparent and understood in view of the detailed description.

DETAILED DESCRIPTION OF THE INVENTION

The following text sets forth a broad description of numerous different embodiments. The description is to be construed as exemplary only and does not describe every possible embodiment since describing every possible embodiment would be impractical, if not impossible, and it will be understood that any feature, characteristic, component, composition, ingredient, product, step or methodology described herein can be deleted, combined with or substituted for, in whole or part, any other feature, characteristic, component, composition, ingredient, product, step or methodology described herein. Numerous alternative embodiments could be implemented, using either current technology or technology developed after the filing date of this patent, which would still fall within the scope of the claims.

It should also be understood that, unless a term is expressly defined in this specification using the sentence "As used herein, the term '_____' is hereby defined to mean . . ." or a similar sentence, there is no intent to limit the meaning of that term, either expressly or by implication, beyond its plain or ordinary meaning, and such term should not be interpreted to be limited in scope based on any statement made in any section of this patent (other than the language of the claims). No term is intended to be essential unless so stated. To the extent that any term recited in the claims at the end of this patent is referred to in this patent in a manner consistent with a single meaning, that is done for sake of clarity only so as to not to confuse the reader, and it is not intended that such a claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. § 112, sixth paragraph.

Embodiments described herein generally relate to systems and methods for remote sensing of remaining battery capacity using on-battery circuitry. The systems and methods utilize on-battery circuitry that provides a signal indicative of remaining battery capacity to a handheld computing device remote from the battery. As used herein, the term "indicative of remaining battery capacity" can mean any signal or measured value such as a battery voltage that can be used to estimate battery capacity. The handheld computing device can receive the signal and use the signal to provide remaining battery capacity information to a user, for example, using a display. The remaining battery capacity information may be an actual voltage measurement and/or a charge amount (e.g., based on a voltage measurement or calculation).

Referring to FIG. 1, a remote sensing system 10 includes a handheld computing device 12 comprising a reader system 15 capable of communicating remotely with a remote charge indicator system 14 that is carried by and operatively connected to a power source, such as a battery 16. The handheld computing device 12 can use the reader system 15 to excite the remote charge indicator system 14 by transmitting an interrogation signal 17, such as a radio frequency (RF) pulse. As will be described below, the handheld computing device 12 remotely determines a time period to charge (or discharge) a capacitor of a resistor-capacitor (RC) circuit to a predetermined voltage. The RC circuit is part of the remote charge indicator system 14 and is located on the battery 16. The time period can be used by the handheld computing device 12 to determine charge information indicative of remaining battery capacity, which can be displayed on a display device 18 and viewed by a user.

The reader system 15 may be part of any suitable handheld computing device 12 such as a cellular phone or other computing device. The display device 18 may be any suitable display device used in a portable, handheld electronic device, such as, for example, LCD display devices, LED display devices, OLED display devices, and other types of display devices which may be heretofore developed. Further, display device 18 may be any other variety of indicators, including, but not limited to a series of lights and/or other types of light devices as opposed to a single integrated display screen. The display device 18 may include an electronic paper component such as an electrophoretic display, which may be an information display that forms visible images by rearranging charged pigment particles using an electric field. The display device 18 may be used for electronically displaying graphics, text, and other elements to a user. In some embodiments, the display device 18 may be a touch-screen user interface that is used with the tip of a finger of the user and/or a stylus or other touching device to select elements from the screen, to draw figures, and to enter text with a character recognition program running on the device. In some embodiments, the device may also include other types of output devices such as for example, sound devices, vibration devices, etc.

Figure 2:
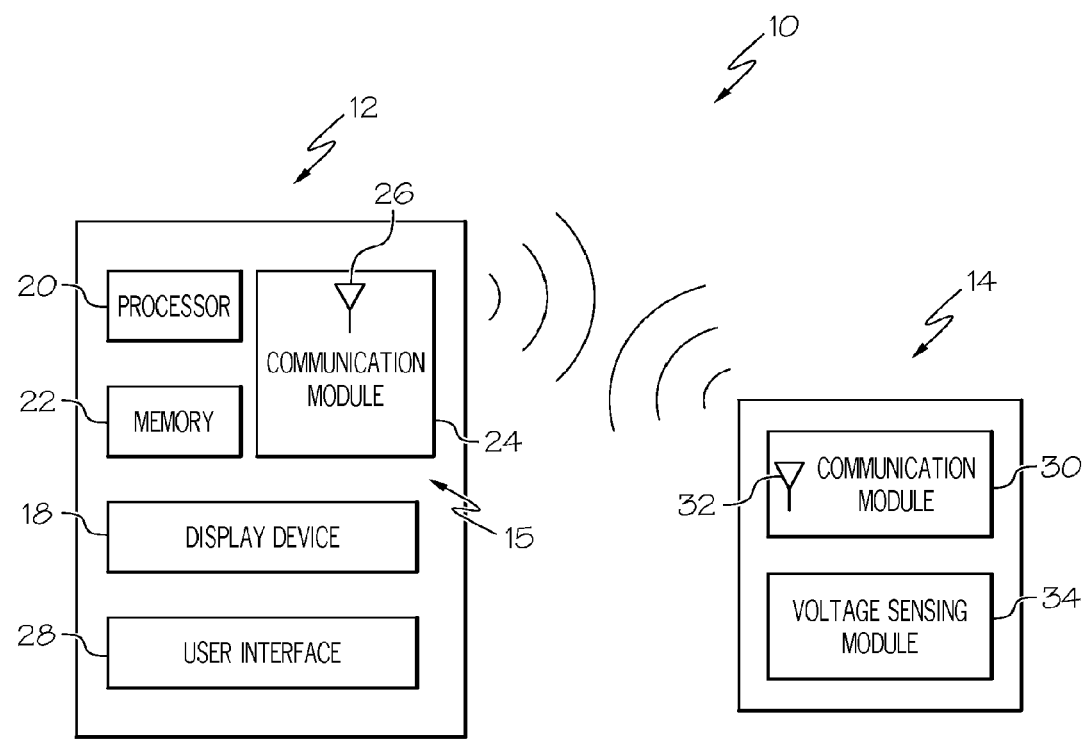
FIG. 2 is a schematic illustration of the remote sensing system of FIG. 1.

FIG. 2 illustrates schematically the remote sensing system 10 including the handheld computing device 12 and the remote charge indicator system 14. The handheld computing device 12 may include a processor 20, memory 22, communications module 24 including an antenna 26 as part of the reader system 15, a user interface 28 and the display device 18. In some embodiments, the handheld computing device 12 may include additional communications modules for communicating with other computers and networks. The processor 20 may run software, such as reader applications saved in the memory 22 that allow the user to control operation of the communications module 24 (e.g., send a user-initiated RF interrogation signal) and other features of the handheld computing device. Logic may also be included that allows the processor to determine the remaining battery capacity information and display the information using the display device 18.

Figure 3:
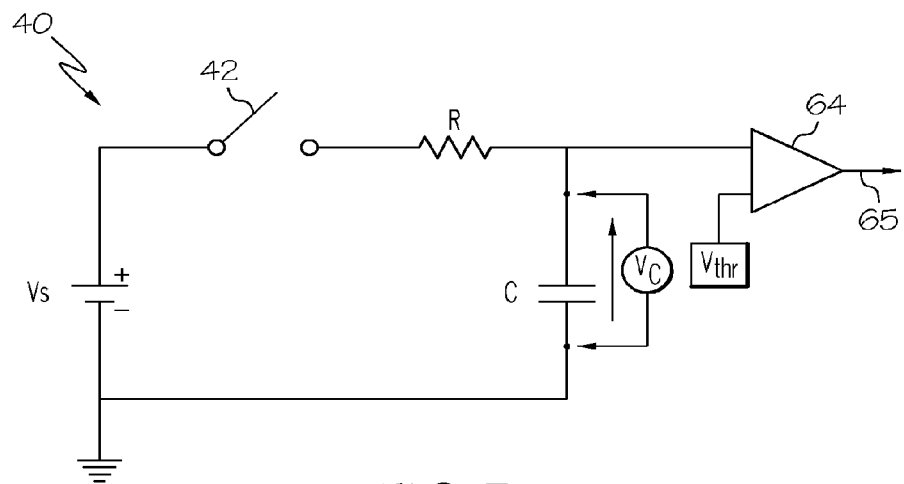
FIG. 3 is a diagram of an RC circuit for use in a voltage sensing module.

The remote charge indicator system 14 may be located on the battery 16 and includes a communications module 30 including an antenna 32 (e.g., an RFID tag) and a voltage sensing module 34 operatively connected to the battery 16. The communications module 30 may include any suitable communications circuitry such as RFID and near field communication (NFC) circuitry and may utilize any suitable frequency bands such as high frequency (HF) 13.56 MHz, ultra-high frequency (UHF) (860-956 MHz) or microwave frequency (2.4-5.8 GHz). Other communications may be used, such as infrared (IR) and ultrasound. The communications module 30 may be powered by the battery 16 (active), may be only partially powered by the battery 16 (semi-active or battery assisted passive) or may not be powered by the battery 16 (passive). The voltage sensing module 34 can be configured to provide an output signal that is proportional to battery voltage, rather than outputting the battery voltage itself. Referring to FIG. 3, a resistor-capacitor (RC) circuit 40 including a resistor R and a capacitor C may be used as part of the voltage sensing module 34 to provide an output signal (capacitor voltage) that is proportional to the battery voltage. A switch 42 (e.g., a transistor) may be used to control charging of the capacitor C. FIG. 3 illustrates the exemplary RC circuit 40 where the charging voltage of the capacitor C is given by:

$$V_c = V_s \left(1 - e^{\frac{t}{RC}}\right)$$

where:
$V_c$ is the capacitor voltage;
$V_s$ is the battery voltage;
R is the resistance of the resistor; and
C is the capacitance of the capacitor.

The time for the capacitor voltage to reach a pre-determined threshold voltage $V_{thr}$ is given by:

$$t = -RC \ln\left(1 - \frac{V_{thr}}{V_s}\right).$$

Figure 4:
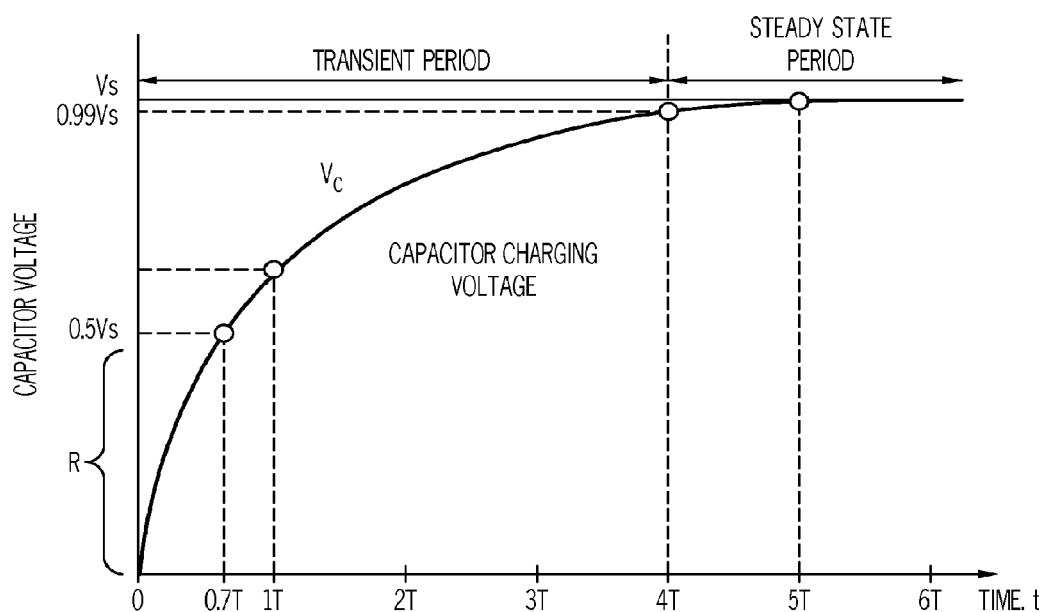
FIG. 4 illustrates a relationship between a charging time of a capacitor C and the battery voltage of the RC circuit of FIG. 3.

Thus, knowing the time t, threshold voltage $V_{thr}$, resistance R and capacitance C, the battery voltage $V_s$ can be calculated. This calculated battery voltage can be correlated to the remaining battery capacity (i.e., battery charge). Referring to FIG. 4, the relation between the charging time of the capacitor C and the battery voltage $V_s$ is exponential. A threshold capacitor voltage $V_{thr}$ can be chosen to be in the quasi-linear region R of the capacitor charging voltage curve (e.g., within less than about ⅖ or 40 percent of battery voltage $V_s$), which can facilitate the determination of the remaining battery capacity information. In some embodiments, the processor 20 may have access to tables saved in memory 22 that can be used to convert the time to a battery voltage $V_s$ for determining the remaining battery capacity information.

Figure 5:
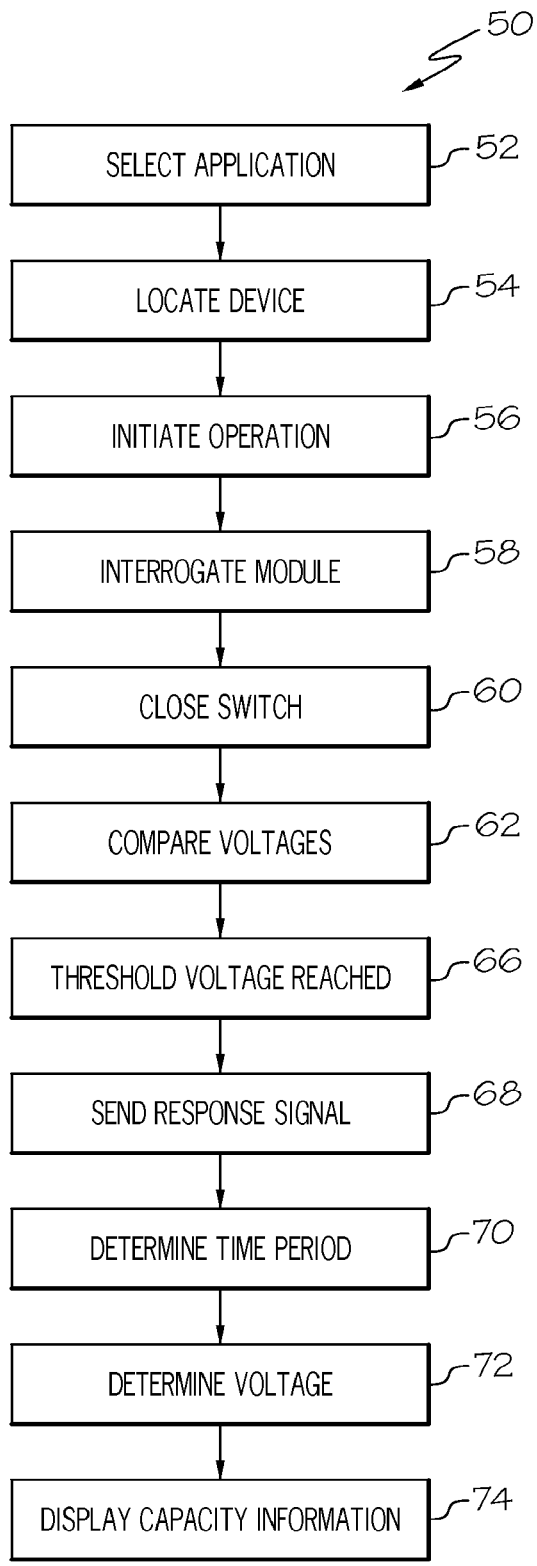
FIG. 5 illustrates a flow chart of an embodiment of a method of remote sensing a remaining battery capacity.

Referring now to FIG. 5, a method 50 of remote sensing remaining battery capacity is illustrated. At step 52, a user selects a battery scanning application on their handheld computing device 12, such as a cellular phone or tablet computer. At step 54, the user places the handheld computing device 12 in close proximity to the battery 16 (e.g., within about a foot or less, such as within about 6 inches or less, such as within about an inch or less, such as touching the battery 16). The distance the handheld computing device 12 is to be placed from the battery 16 and the remote charge indicator system 12 can depend, at least in part, on the communications circuitry used. A battery scanning operation is initiated at step 56 using the user interface 28 (FIG. 2). Alternatively, a battery scanning operation may be initiated automatically (e.g., using a periodic scanning setting). At step 58, the communications module 24 of the reader system 15, in response to the user input or automatically sensing battery presence, can interrogate the communications module 30 of the remote charge indicator system 14. At step 60, the switch 42 of the RC circuit 40 (FIG. 3) is closed and the battery charges the capacitor C. At step 62, a comparator 64 (FIG. 3) compares the increasing voltage of the capacitor C to the predetermined threshold voltage. When the capacitor voltage reaches the predetermined threshold voltage, the comparator 64 sends a signal 65 to the communications module 30 of the remote charge indicator system 14 at step 66. At step 68, the communications module 30 of the remote charge indicator system 14 may send a response signal (e.g., an RF response signal) to the communications module 24 of the handheld computing device 12. At step 70, the processor 20 determines a time period between the time the communications module 30 is interrogated at step 58 and the time the response signal is received at step 68. The time period is used to determine the remaining battery capacity and the remaining battery capacity information at step 72. In some embodiments, the remaining battery capacity information may be displayed on the display device 18 at step 74. The remaining battery capacity information can provide an indication to the user of the battery capacity remaining. In some embodiments, the remaining battery capacity information may include the battery voltage and/or the device remaining runtime in different modes.

Figure 6:
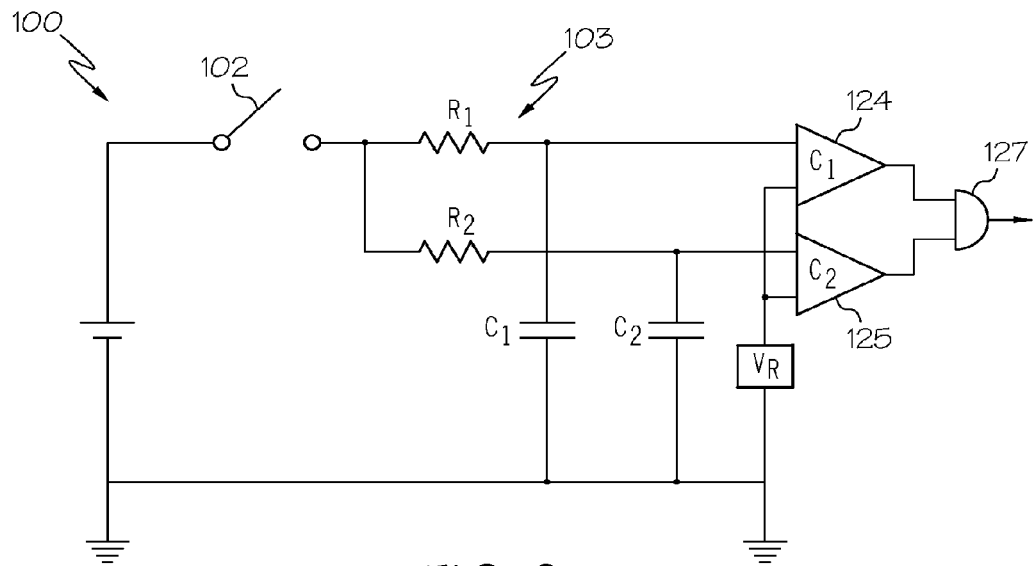
FIG. 6 is a diagram of another embodiment of two RC circuits for use in a voltage sensing module.

While the above embodiments utilize time from interrogation to receipt of the response signal to determine battery voltage and provide the remaining battery capacity information, other configurations are possible. As another example, the difference in charging time of multiple RC circuits with different time constants may be used. Referring to FIG. 6, a resistor-capacitor (RC) circuit 100 including resistor $R_1$ and capacitor $C_1$ as part of a first RC circuit portion 103 and resistor $R_2$ and capacitor $C_2$ as part of a second RC circuit portion 105 may be used as part of the voltage sensing module 34 to provide an output signal (capacitor voltage) that is proportional to the battery voltage. A switch 102 (e.g., a transistor) may be used to control charging of the capacitors $C_1$ and $C_2$. FIG. 6 illustrates the exemplary RC circuit 100 where the difference in the charging time of the two capacitors $C_1$ and $C_2$ with different time constants from the same battery voltage to charge to the same threshold voltage given by:

$$t_1 - t_2 = -(R_1 C_1 - R_2 C_2) \ln\left(1 - \frac{V_{thr}}{V_s}\right).$$

Figure 7:
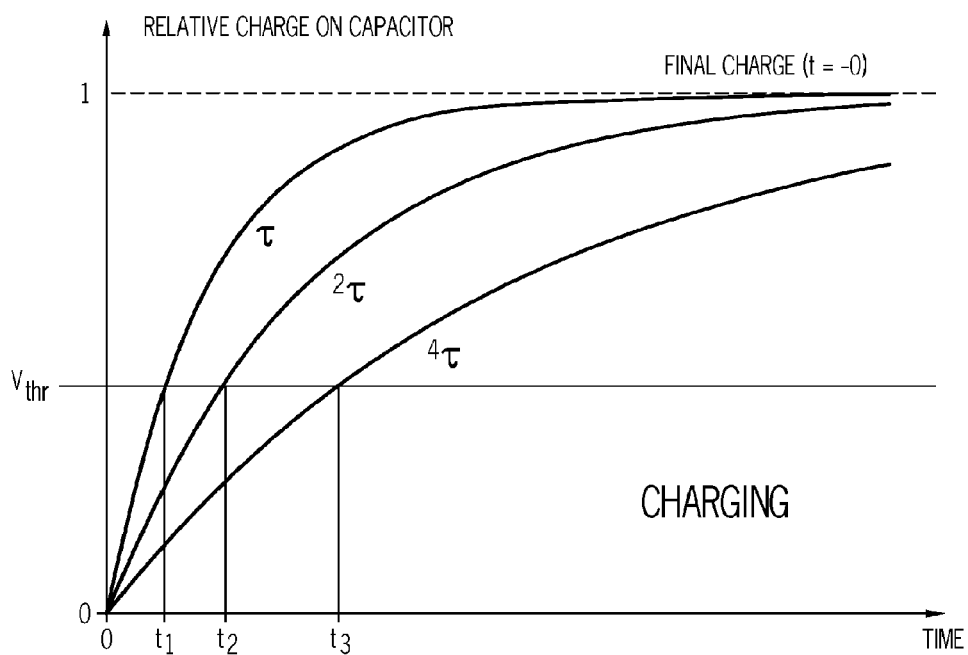
FIG. 7 illustrates a relationship between charging times of three different capacitors C and the battery voltage for RC circuits having different time constants.

Thus, knowing the times $t_1$, $t_2$, resistances $R_1$, $R_2$, threshold voltage $V_{thr}$ and capacitances $C_1$, $C_2$, the battery voltage $V_s$ can be calculated. This calculated battery voltage can be correlated to the remaining battery capacity. Referring to FIG. 7, capacitor voltage curves are illustrated for three capacitors each being part of RC circuits having different time constants τ. The relation between the charging time of the capacitors $C_1$ and $C_2$ (and $C_3$) and the battery voltage $V_s$ is exponential. Measuring the time difference between two response signals can eliminate the need to utilize the time of interrogation.

Figure 8:
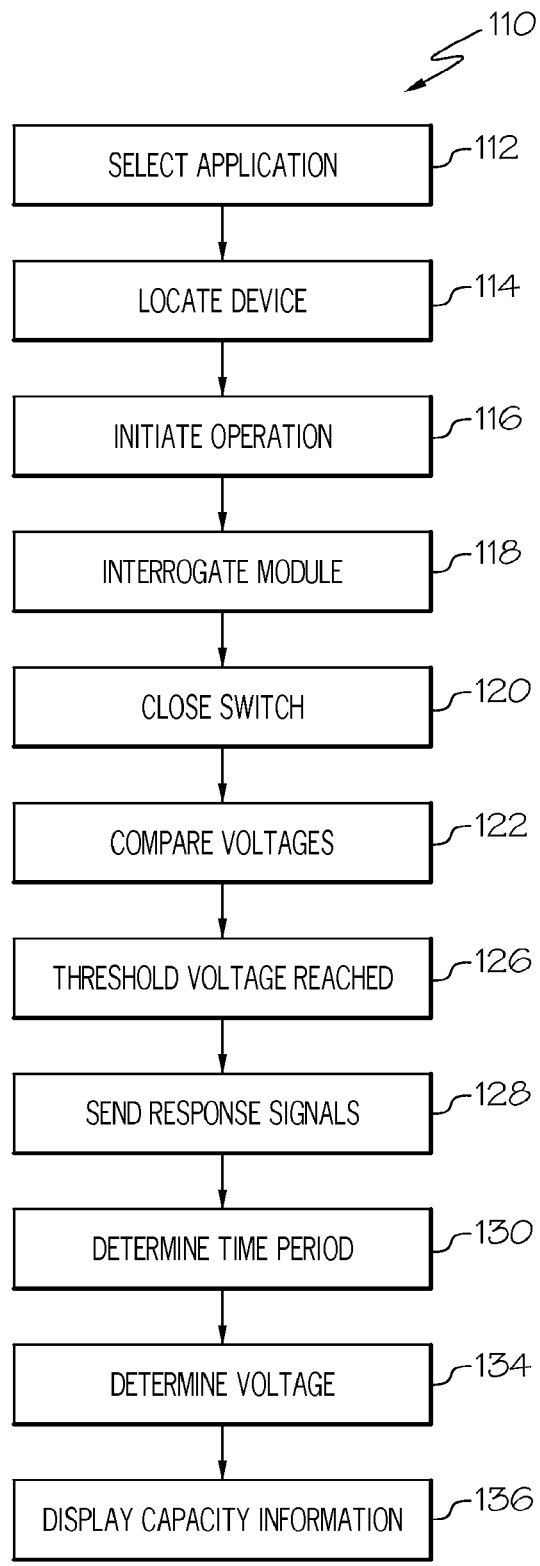
FIG. 8 illustrates a flow chart of another embodiment of a method of remote sensing a remaining battery capacity.

Referring to FIG. 8, another method 110 of remote sensing remaining battery capacity is illustrated. At step 112, a user selects a battery scanning application on their handheld computing device 12, such as a cellular phone or tablet computer. At step 114, the user places the handheld computing device 12 in close proximity to the battery 16. A battery scanning operation is initiated at step 116 using the user interface 28 (FIG. 2) or automatically by periodic scanning. Alternatively, a battery scanning operation may be initiated automatically. At step 118, the communications module 24 of the reader system 15, in response to the user input, can interrogate the communications module 30 of the remote charge indicator system 14. At step 120, the switch 102 of the RC circuit 100 (FIG. 6) is closed and the battery charges the capacitors $C_1$ and $C_2$. At step 122, a comparator 124 and 125 (FIG. 6) compares the increasing voltages of the capacitors $C_1$ and $C_2$ to the same predetermined threshold voltage. When the capacitor voltages reach the predetermined threshold voltage, the comparator 124 and 125 sends a first signal (associated with the capacitor $C_1$) and a second signal (associated with the capacitor $C_2$) to a logic module 127 at step 126, which can provide a pulse having a duration that corresponds to a time period between the first and second signals. At step 128, the communications module 30 of the remote charge indicator system 14 may send the pulse to the communications module 24 of the handheld computing device 12. At step 130, the processor 20 determines a time period of the pulse or between the first and second response signals. The time period is used to determine remaining battery capacity information at step 134. In some embodiments, the remaining battery capacity information may be displayed on the display device 18 at step 136. The remaining battery capacity information can provide an indication to the user of the battery capacity remaining. In some embodiments, the remaining battery capacity information may include the battery voltage.

Figure 9:
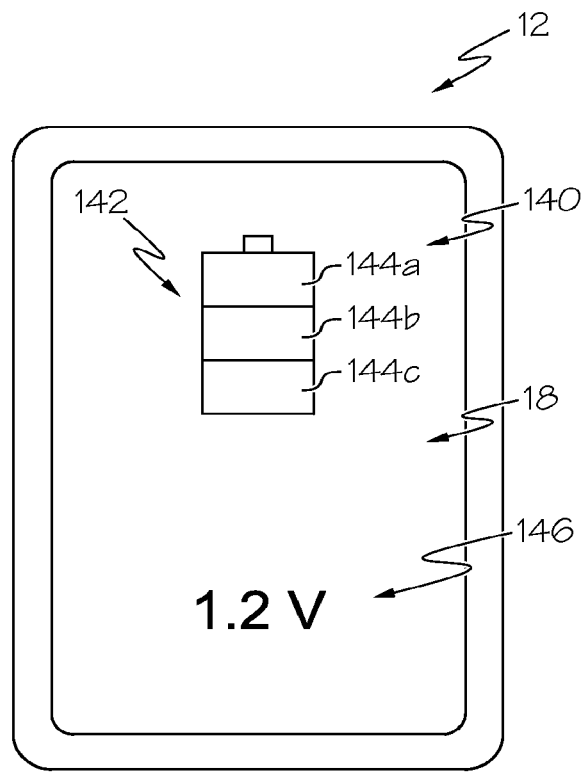
FIG. 9 illustrates an exemplary handheld computing device displaying remaining battery capacity information.

Referring to FIG. 9, the handheld computing device 12 is illustrated showing the display device 18. The remaining battery capacity information 140 may be displayed to the user in the form of graphic indicia 142. The graphic indicia 142 may be an image of a battery level indicator that includes charge level bars 144a, 144b and 144c that are used to indicate the battery capacity remaining. As one example, for a 1.5V AA size alkaline battery, a calculated voltage of above a first predetermined voltage (e.g., about 1.45V) may result in the processor 20 displaying about a full battery capacity of all three charge level bars 144a, 144b and 144c. For a calculated voltage of between the first predetermined voltage and a second predetermined lower voltage (e.g., between about 1.35V and about 1.45V), the processor 20 may display only two of the charge level bars 144b and 144c indicating a charge level below a certain percentage. In instances where the processor calculates a battery voltage of between the second predetermined voltage and a third predetermined lower voltage (e.g., between about 1.25V and about 1.35V), only one charge level bar 144c may be displayed. As another example, for a 1.5V AA size nickel-metal hydride battery, a calculated voltage of above a first predetermined voltage (e.g., about 1.35V) may result in the processor 20 displaying about a full battery capacity of all three charge level bars 144a, 144b and 144c. For a calculated voltage of between the first predetermined voltage and a second predetermined lower voltage (e.g., between about 1.25V and about 1.35V), the processor 20 may display only two of the charge level bars 144b and 144c indicating a charge level below a certain percentage. In instances where the processor calculates a battery voltage of between the second predetermined voltage and a third predetermined lower voltage (e.g., between about 1.2V and about 1.25V), only one charge level bar 144c may be displayed. Should the processor 20 calculate a battery voltage less than the third predetermined voltage, none of the charge level bars may be displayed. Any suitable display arrangement can be utilized including more or less than three charge level bars. The graphic indicia 142 may also change colors, depending on the calculated charge level. The remaining battery capacity information 140 being displayed may include a numerical voltage value 146.

Figure 10:
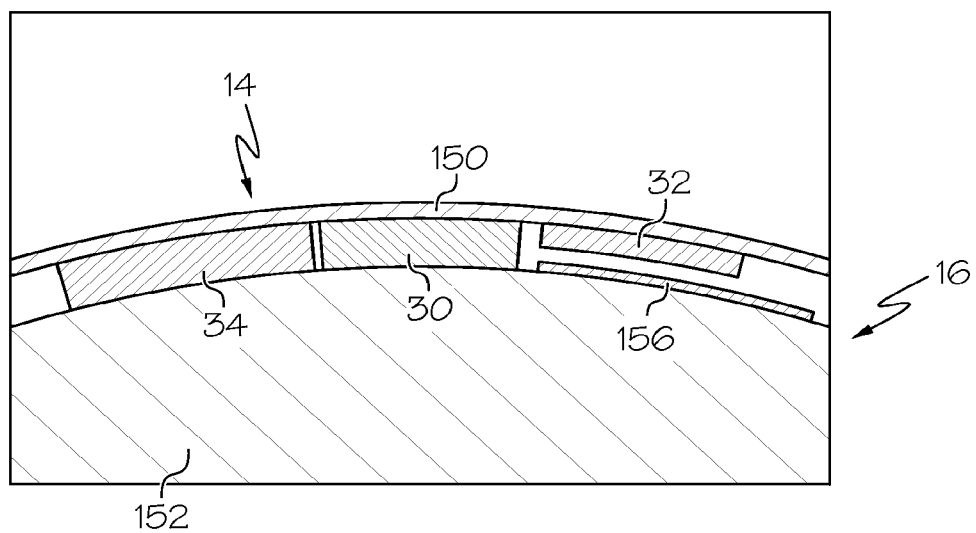
FIG. 10 is a diagrammatic detail view of the battery of FIG. 1.

Referring now to FIG. 10, the battery 16 is illustrated and includes a label layer 150 and a battery housing 152 about which the label layer 150 is applied. The remote charger indicator system 14 including the communications module 30, the antenna 32 and the voltage sensing module 30 are located between the label layer 150 and the battery housing 152. In some embodiments, the communications module 30 (e.g., an RFID tag), antenna 32 and the voltage sensing module 34 (the RC circuit) may all be part of an integrated circuit (IC). In some embodiments, the label layer 150, itself, may include a silicon IC. A thin (e.g., less than about 200 micrometers) magnetic diverter 156 formed of ferrite materials can be placed between the antenna 32 and the battery housing 152 to inhibit interference with the antenna 32. Any suitable battery may be used, such as alkaline, nickel-metal hydride, lithium, etc. The battery may be rechargeable or non-rechargeable.

In some embodiments, the communications module 30 may include memory that stores unique identification information. The identification information may be provided to the handheld computing device 12 when the communications module 30 sends the response signal. The handheld computing device 12 may use the identification information to distinguish between multiple batteries being tested simultaneously. For example, in one embodiment, a series of batteries may be tested and the remaining battery capacity information for the lowest voltage battery (i.e., the weakest link) may be displayed. As another embodiment, a device using the batteries may include a voltage sensing module, which can be used to determine a total remaining battery capacity for all batteries in the device. The voltage sensing module may be located, for example, in a battery compartment and connected to a device power input. The remaining battery capacity information may not only include remaining battery capacity, but may also include usage information, such as remaining photos, play time, talk time, etc.

The above-described remote sensing systems provide an electronic circuit on a battery for remote sensing of battery voltage and determining remaining battery capacity information. The remote sensing systems utilize a distributed analog to digital conversion where the processor used for calculating the battery voltage and determining the remaining battery capacity information is located in the handheld computing device, and not on the battery, leaving a minimum of components on the battery. While battery testing is described primarily above, the testing systems can be applied to any type of remote sensing systems where a voltage measurement is required and is not limited to battery monitoring. The remote sensing systems can be applied to any of disposable or rechargeable cells of any size (e.g., AAAA, AAA, AA, C, D, 9V) and to special sizes for specific applications (e.g., coin, button, prismatic). The remote sensing systems can be applied to prismatic or round rechargeable Lithium Ion cells in cases where a device does not include a fuel gauge or the device has replaceable batteries to that the status of a replacement battery can be determined remotely. The remote sensing systems can be applied to any portable or battery powered device, monitoring total battery voltage in the device rather than individual cell voltages. The above remote charge indicator systems can also operate by discharging the capacitors. For example, the capacitors can always be placed in parallel with the battery and equalized with the battery voltage. Upon interrogating the communications module, the capacitor may be disconnected from the battery and discharge through the resistor down to a predetermined threshold voltage. That time difference is a function of battery voltage and can be used to calculate the battery voltage and remaining battery capacity.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made. It is therefore intended to cover in the appended claims all such changes and modifications.

What is claimed:

1. A method of remote sensing a remaining battery capacity, comprising:

receiving, at a communications module of a remote charge indicator system and from a reader system of a handheld computing device, an interrogation signal;

responsive to receiving the interrogation signal, closing a switch, wherein closing the switch causes a battery to charge or discharge (i) a first capacitor of a first RC circuit portion and (ii) a second capacitor of a second RC circuit portion;

receiving, at the communications module, a first indication in response to the voltage of the first capacitor reaching a predetermined voltage threshold;

transmitting, to the reader system, the first indication at a first time;

receiving, at the communications module, a second indication in response to the voltage of the second capacitor reaching the predetermined voltage threshold; and transmitting, to the reader system, the second indication at a second time, wherein the difference between the first time and the second time corresponds to the remaining battery capacity of the battery.

2. The method of claim 1, wherein the first capacitor has a first time constant and the second capacitor has a second time constant different than the first time constant.

3. A remote charge indicator system operatively connected to a battery, the remote charge indicator system comprising:

a communications module comprising an antenna that receives an interrogation signal from a reader system; and a voltage sensing module comprising a switch that closes when the communications module receives the interrogation signal, a first RC circuit portion having a first time constant comprising a first resistor and a first capacitor, and a second RC circuit portion having a second time constant comprising a second resistor and a second capacitor, wherein the first time constant is different than the second time constant, wherein the voltage sensing module provides a pulse as an output signal to the communications module, wherein the pulse begins when the first capacitor is charged or discharged to a predetermined threshold voltage using the battery and ends when the second capacitor is charged or discharged to the predetermined threshold voltage using the battery, and wherein the duration of the pulse corresponds to the voltage of the battery and the remaining battery capacity of the battery.

4. The remote charge indicator system of claim 3, wherein the communications module comprises an RFID tag.

5. The remote charge indicator system of claim 3, wherein the voltage sensing module comprises a first comparator that begins the pulses when the first capacitor charges or discharges to the predetermined threshold voltage, and wherein the voltage sensing module comprises a second comparator that ends the pulse when the second capacitor charges or discharges to the predetermined threshold voltage.

6. A method of remote sensing a remaining battery capacity, comprising:

receiving, at a communications module of a remote charge indicator system and from a reader system of a handheld computing device, an interrogation signal;

responsive to receiving the interrogation signal, closing a switch, wherein closing the switch causes a battery to charge or discharge (i) a first capacitor of a first RC circuit portion and (ii) a second capacitor of a second RC circuit portion;

receiving, at the communications module, a pulse having a duration that corresponds to a time difference between when the first capacitor reaches a predetermined threshold voltage and when the second capacitor reaches the predetermined threshold; and transmitting, to the reader system, the pulse, wherein the duration of the pulse corresponds to the remaining battery capacity of the battery.

7. The method of claim 6, wherein the first capacitor has a first time constant and the second capacitor has a second time constant different than the first time constant.

* * * * *